United States Patent
Chen et al.

(10) Patent No.: US 10,163,651 B1
(45) Date of Patent: Dec. 25, 2018

(54) STRUCTURE AND METHOD TO EXPOSE MEMORY CELLS WITH DIFFERENT SIZES

(71) Applicant: Taiwan Semiconductor Manufacturing Co., Ltd., Hsin-Chu (TW)

(72) Inventors: Sheng-Chau Chen, Tainan (TW); Cheng-Tai Hsiao, Tainan (TW); Cheng-Yuan Tsai, Chu-Pei (TW); Hsun-Chung Kuang, Hsinchu (TW); Yao-Wen Chang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/883,748

(22) Filed: Jan. 30, 2018

Related U.S. Application Data

(60) Provisional application No. 62/564,360, filed on Sep. 28, 2017.

(51) Int. Cl.
| | |
|---|---|
| *H01L 45/00* | (2006.01) |
| *H01L 21/311* | (2006.01) |
| *H01L 21/3105* | (2006.01) |
| *H01L 43/02* | (2006.01) |
| *H01L 23/528* | (2006.01) |
| *H01L 43/08* | (2006.01) |

(52) U.S. Cl.
CPC .. *H01L 21/31116* (2013.01); *H01L 21/31053* (2013.01); *H01L 23/528* (2013.01); *H01L 43/02* (2013.01); *H01L 43/08* (2013.01); *H01L 45/1233* (2013.01)

(58) Field of Classification Search
CPC ............. H01L 21/31116; H01L 23/528; H01L 45/1233; H01L 21/31053; H01L 43/02; H01L 43/08
See application file for complete search history.

(56) References Cited

U.S. PATENT DOCUMENTS 9,799,705 B1 * 10/2017 Yi ..................... H01L 27/2436

\* cited by examiner

*Primary Examiner* — David Vu
(74) *Attorney, Agent, or Firm* — Eschweiler & Potashnik, LLC

(57) ABSTRACT

A memory cell with an etch stop layer is provided. The memory cell comprises a bottom electrode disposed over a substrate. A switching dielectric is disposed over the bottom electrode and having a variable resistance. A top electrode is disposed over the switching dielectric. A sidewall spacer layer extends upwardly along sidewalls of the bottom electrode, the switching dielectric, and the top electrode. A lower etch stop layer is disposed over the lower dielectric layer and lining an outer sidewall of the sidewall spacer layer. The lower etch stop layer is made of a material different from the sidewall spacer layer and protects the top electrode from damaging during manufacturing processes. A method for manufacturing the memory cell is also provided.

20 Claims, 10 Drawing Sheets

STRUCTURE AND METHOD TO EXPOSE MEMORY CELLS WITH DIFFERENT SIZES

REFERENCE TO RELATED APPLICATION

This Application claims priority to U.S. Provisional Application No. 62/564,360 filed on Sep. 28, 2017, the contents of which are hereby incorporated by reference in their entirety.

BACKGROUND

Many modern day electronic devices contain non-volatile memory, which is able to store data in the absence of power. Non-volatile memory such as magnetoresistive random-access memory (MRAM) and resistive random access memory (RRAM) are promising candidates for next generation non-volatile memory technology due to relative simple structures and their compatibility with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
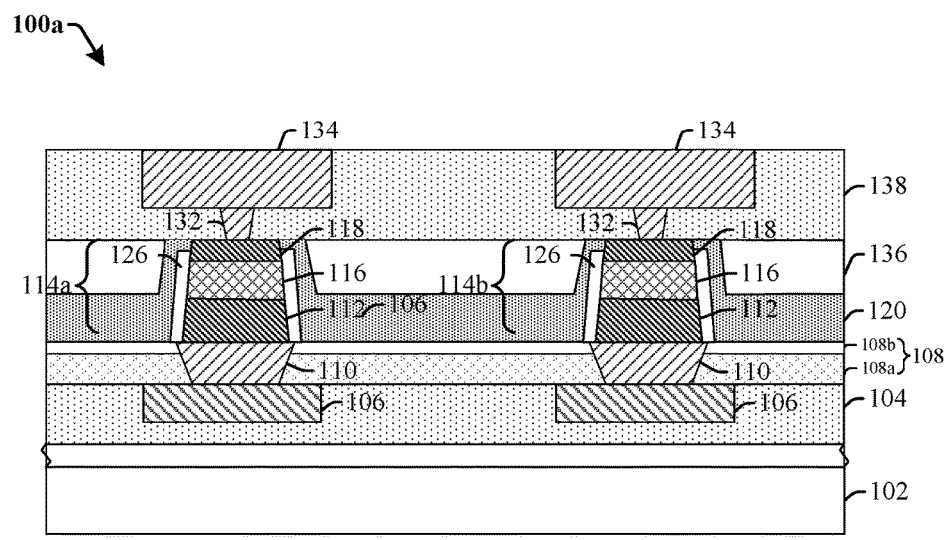
FIG. 1A illustrates a cross-sectional view of some embodiments of a memory device with an etch stop layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "First", "second", "third", etc. are not intended to be descriptive of the corresponding element. Therefore, "a first dielectric layer" described in connection with a first figure may not necessarily correspond to a "first dielectric layer" described in connection with another figure.

A non-volatile memory device includes a memory cell array having a plurality of memory cells. Each of the memory cells includes a top electrode and a bottom electrode separated by a switching dielectric. Depending on a voltage applied to the pair of electrodes, the switching dielectric will undergo a reversible change between a high resistance state associated with a first data state (e.g., a '0' or 'RESET') and a low resistance state associated with a second data state (e.g., a '1' or 'SET'). The memory cell is compatible with complementary metal-oxide-semiconductor (CMOS) logic fabrication processes and can be inserted between a lower metallization line and an upper metallization line for data storage and transmission. In some applications, the memory device may include memory cells with different sizes. The memory cells may have different lateral dimensions as well as different vertical thicknesses. Thus a height from the lower metallization line to a top electrode of a memory cell can vary depending on the memory cell size. The variation of the vertical heights makes it a challenge to expose the top electrodes of memory cells with different sizes during the fabrication: a top electrode of a smaller memory cell may not be well exposed until another top electrode of a larger memory cell is damaged.

The present application is related to an improved memory device having an etch stop layer lining a memory cell, and corresponding manufacturing methods. In some embodiments, referring to FIG. 1A or FIG. 1B for example, a memory device comprises a first memory cell 114a and a second memory cell 114b disposed over a substrate 102. Each of the memory cells 114a, 114b comprises a bottom electrode 112, a switching dielectric 116 disposed over the bottom electrode 112 and having a variable resistance, and a top electrode 118 disposed over the switching dielectric 116. The bottom electrode 112 is coupled to a bottom electrode via 110 surrounded by a lower dielectric layer 108. A sidewall spacer layer 126 is disposed over the bottom electrode via 110 and the lower dielectric layer 108 and extends upwardly along sidewalls of the bottom electrode 112, the switching dielectric 116, and the top electrode 118. A lower etch stop layer 120 is disposed over the lower dielectric layer 108 and lining an outer sidewall of the sidewall spacer layer 126. An upper dielectric layer 136 is disposed on the lower etch stop layer 120 and surrounding an upper portion of the sidewall spacer layer 126. The lower etch stop layer 120 is made of a dielectric material that can protect the memory cell 114a, 114b during polishing and etching processes for top electrode exposure. For example, the lower etch stop layer 120 and the upper dielectric layer 136 may be formed overlying the memory cell 114a, 114b (see FIG. 4 for example) and then subject to an etching back process to expose the top electrode 118 (see FIG. 6 for example). The lower etch stop layer 120 may comprise a dielectric material having a distinct etch selectivity from the upper dielectric layer 136 with respect to the etchant of the etching back process, such that the lower etch stop layer 120 can be retained and protect the top electrode from damage. Thereby, the polishing and etching processes can be better controlled and the top electrode 118 of the memory cell 114a, 114b can be well exposed after a more precise controlled removal of the lower etch stop layer 120.

The bottom electrode 112 of the memory cell 114a, 114b is a conductive material, such as titanium nitride. The bottom electrode 112 may also comprise, for example, titanium, tantalum, tantalum nitride, platinum, iridium, tungsten, ruthenium, or the like. In some embodiments, the memory cell 114a, 114b is a magnetoresistive random access memory (MRAM) cell and the resistance switching dielectric 116 can comprise a magnetic tunnel junction (MTJ) structure having a bottom ferromagnetic layer and a top ferromagnetic layer separated by a tunnel barrier layer. In some other embodiments, the memory cell 114a, 114b is a resistive random access memory (RRAM) cell and the resistance switching dielectric 116 can comprise a RRAM dielectric layer. The switching dielectric 116 may be a high-k layer (i.e., a layer with a dielectric constant k greater than 3.9), for example, tantalum oxide, tantalum hafnium oxide, tantalum aluminum oxide, or another material that includes tantalum, oxygen, and one or more other elements. The bottom electrode via 110 is made of a conductive material, such as platinum, iridium, ruthenium or tungsten. The lower dielectric layer 108 surrounds the bottom electrode via 110 and comprises one or more layers of dielectrics. The lower dielectric layer 108 may comprise silicon carbide, silicon nitride, silicon oxide, or one or more layers of composite dielectric films. For example, the lower dielectric layer 108 may comprise a silicon-rich oxide layer 108b arranged on a silicon carbide layer 108a. Through the bottom electrode via 110, the memory cell 114a, 114b shown in FIG. 1A or FIG. 1B may be coupled to a bottom metallization line 106 disposed within a bottom interlayer dielectric layer 104. The bottom electrode via 110 may also function as a diffusion barrier layer to prevent the bottom metallization lines 106 material from diffusing into the bottom electrode 112. The bottom metallization line 106 may be, for example, a metal, such as copper. The bottom interlayer dielectric layer 104 may be, for example, an oxide, a low-k dielectric (i.e., a dielectric with a dielectric constant k less than silicon dioxide) or an extreme low-k dielectric (a dielectric with a dielectric constant k less than about 2).

In some embodiments, the top electrode 118 may comprise one or more metal or metal composition layers comprising, for example, titanium, titanium nitride, tantalum, tantalum nitride, or the like. In some embodiments, the top electrode 118 is electrically coupled to the top metallization line 134 of the upper interconnect structure 142 through a top electrode via 132 arranged between the top electrode 118 and the top metallization line 134. The top electrode via 132 may be, for example, a conductive material, such as such as copper, aluminum, or tungsten. During operation of the memory cell 114a, 114b, voltages are applied between the top electrode 118 and the bottom electrode 112 to read, set, or erase the memory cell 114a, 114b by forming or breaking one or more conductive filaments of the switching dielectric 116. Thus the memory cell 114a, 114b can have a variable resistance in a comparatively low or high resistance state to stand for low or high bit status, for example.

As shown in FIG. 1A, in some embodiments, the sidewall spacer layer 126 is disposed directly on the lower dielectric layer 108 and contacting sidewalls of the bottom electrode 112, the switching dielectric 116, and the top electrode 118. The sidewall spacer layer 126 protects the bottom electrode 112, the switching dielectric 116, and the top electrode 118 from shortage. In some embodiments, the top surface of the sidewall spacer layer 126 is lower than that of the top electrode 118, such that an uppermost point of the sidewall spacer layer 126 is located on the sidewall surface of the top electrode 118. The lower etch stop layer 120 is arranged aside of the sidewall spacer layer 126 and directly on the lower dielectric layer 108. In some embodiments, the lower etch stop layer 120 extends laterally between the memory cells 114a, 114b, and extends upwardly to cover sidewall and top surfaces of the sidewall spacer layer 126. The upper dielectric layer 136 may be arranged directly on the lower etch stop layer 120. In some embodiments, the sidewall spacer layer 126 is separated from the upper dielectric layer 136 by the lower etch stop layer 120. The upper dielectric layer 136 may have a bottom surface separated from a top surface of the lower dielectric layer 108 by the lower etch stop layer 120. The lower etch stop layer 120 and the top electrode 118 may have top surfaces aligned or coplanar, and may be further coplanar with a top surface of the upper dielectric layer 136. The top electrode 118 may be coupled to a top metallization line 134 through a top electrode via 132. The top metallization line 134 and the top electrode via 132 are surrounded by a top interlayer dielectric layer 138. In some embodiments, bottom surfaces of the top metallization line 134 and the top interlayer dielectric layer 138 and top surfaces of the top electrode 118 and the lower etch stop layer 120 are coplanar. The lower etch stop layer 120 is made of a dielectric material different from that of the sidewall spacer layer 126. The sidewall spacer layer 126 may comprise, for example, silicon nitride. The upper dielectric layer 136 may comprise, for example, silicon dioxide. The lower etch stop layer 120 may be made of silicon oxynitride. During the fabrication process, the lower etch stop layer 120 is more resistive to the etchant (comparing to the upper dielectric layer 136 or the sidewall spacer layer 126) when exposing the top electrode 118, thereby providing extra support and protection to the top electrode 118 from being damaged. For example, the lower etch stop layer 120 may have an etching rate to the etchant about 10 times smaller than the upper dielectric layer 136 or the sidewall spacer layer 126.

Figure 1B:
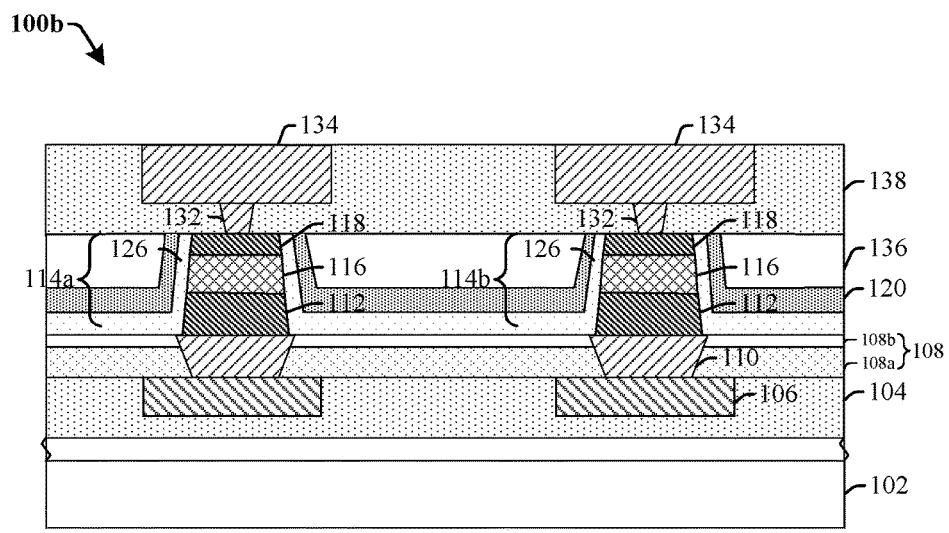
FIG. 1B illustrates a cross-sectional view of some alternative embodiments of a memory device with an etch stop layer.

As shown in FIG. 1B, in some alternative embodiments, the sidewall spacer layer 126 is disposed directly on the lower dielectric layer 108 and extends in a lateral direction continuously between the memory cells 114a, 114b, while the sidewall spacer layer 126 comprises discrete portions respectively surrounding the memory cells 114a, 114b in the embodiments shown in FIG. 1A. The lower etch stop layer 120 is arranged directly on the sidewall spacer layer 126. Thus, the sidewall spacer layer 126 may separate the lower etch stop layer 120 from the lower dielectric layer 108. The sidewall spacer layer 126 extends upwardly and contacting sidewalls of the bottom electrode 112, the switching dielectric 116, and the top electrode 118. In some embodiments, the top surface of the sidewall spacer layer 126 is coplanar with top surfaces of the top electrode 118 and the lower etch stop layer 120. The upper dielectric layer 136 may be arranged directly on the lower etch stop layer 120, and may have a top surface coplanar with that of the lower etch stop layer 120. Similar to the embodiments shown in FIG. 1A, the sidewall spacer layer 126 protects the bottom electrode 112, the switching dielectric 116, and the top electrode 118 from shortage. The top electrode 118 may be coupled to a top metallization line 134 through a top electrode via 132, which are surrounded by a top interlayer dielectric layer 138. In some embodiments, bottom surfaces of the top metallization line 134 and the top interlayer dielectric layer 138 and top surfaces of the top electrode 118, the sidewall spacer layer 126, and the lower etch stop layer 120 are coplanar. The lower etch stop layer 120 is made of a dielectric material different from that of the sidewall spacer layer 126. The sidewall spacer layer 126 may comprise, for example, silicon nitride. The upper dielectric layer 136 may comprise, for example, silicon dioxide. The lower etch stop layer 120 may be made of silicon oxynitride. During the fabrication process, the lower etch stop layer 120 is more resistive to the etchant (comparing to the upper dielectric layer 136 or the sidewall spacer layer 126) when exposing the top electrode 118, thereby providing extra support and protection to the top electrode 118 from being damaged.

Figure 2:
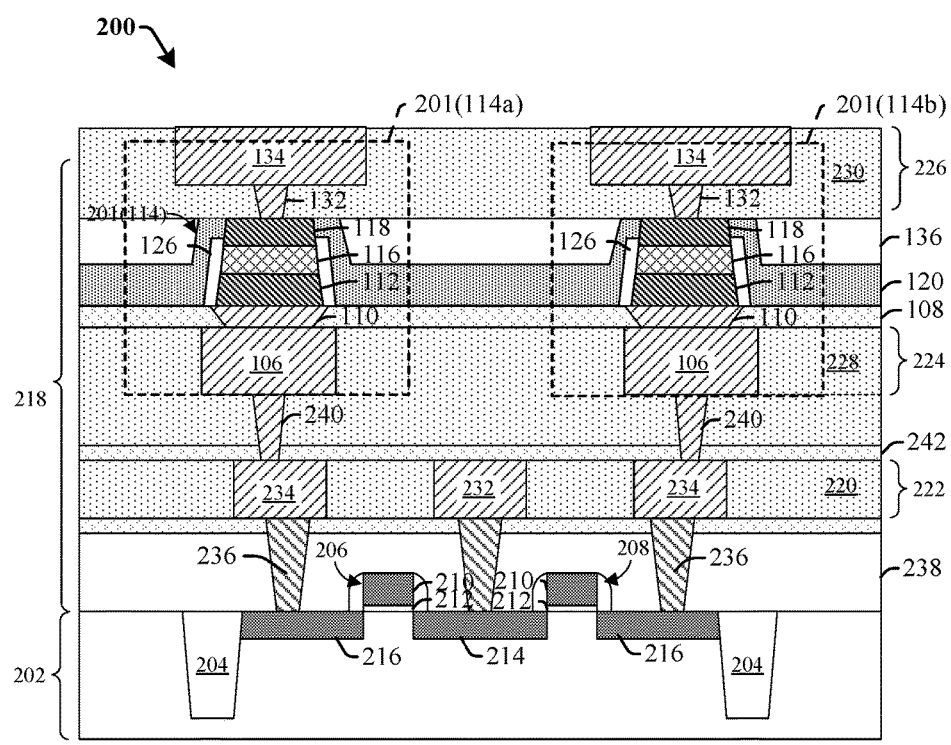
FIG. 2 illustrates a cross-sectional view of some embodiments of an integrated circuit with the memory device of FIG. 1A or FIG. 1B.

FIG. 2 illustrates a cross-sectional view of an integrated circuit device 200 including a memory cell 201 according to some additional embodiments. The memory cell 201 may have the same structure as the memory cell 114a, 114b shown in FIG. 1A or FIG. 1B and described above. As shown in FIG. 2, the memory cell 201 can be disposed over a substrate 202. The substrate 202 may be, for example, a bulk substrate (e.g., a bulk silicon substrate) or a silicon-on-insulator (SOI) substrate. One or more shallow trench isolation (STI) regions 204 or oxide-filled trenches are disposed in the substrate 202. A pair of word line transistors 206, 208 is spaced between the STI regions 204. The word line transistors 206, 208 extend parallel to each other, and include word line gates 210 separated from the substrate 202 by word line dielectric layers 212, and source/drain regions 214, 216. The source/drain regions 214, 216 are embedded within the surface of the substrate 202 between the word line gates 210 and the STI regions 204. The word line gates 210 may be, for example, doped polysilicon or a metal, such as titanium nitride or tantalum nitride. The word line dielectric layers 212 may be, for example, an oxide, such as silicon dioxide. A bottom-most ILD layer 238 is disposed overlying the word line transistors 206, 208. The bottom-most ILD layer 238 may be an oxide.

A back-end-of-line (BEOL) metallization stack 218 is arranged over the word line transistors 206, 208. The BEOL metallization stack 218 includes a plurality of metallization layers 222, 224, 226 respectively arranged within the interlayer dielectric layers 220, 228, 230. The metallization layers 222, 224, 226 may be, for example, a metal, such as copper or aluminum. The interlayer dielectric layers 220, 228, 230 may be, for example, a low-κ dielectric, such as porous undoped silicate glass, or an oxide, such as silicon dioxide. Dielectric layers 108, 242 may be disposed to separate the interlayer dielectric layers 220, 228, 230. The metallization layers 222, 224, 226 include a source line 232 coupled to the source/drain region 214 shared by the word line transistors 206, 208. Further, the metallization layers 222, 224, 226 include a bit line 134 connected to the memory cell 201 and further connected to the source/drain region 216 of the word line transistor 206 or the word line transistor 208 through a plurality of metallization lines, such as metallization lines 106, 234, and a plurality of vias, such as vias 132, 110, 240. A contact 236 extends from the metallization line 234 through the bottom-most ILD layer 238 to reach the source/drain region 216. The vias 132, 110, 240 and the contact 236 may be, for example, a metal, such as copper, gold, or tungsten.

The memory cell 201 is inserted between a top metallization line 134 and a bottom metallization line 106. Similar as described above associated with FIG. 1A or FIG. 1B, the memory cell 201 comprises a bottom electrode 112 connecting or seamless contacting a bottom electrode via 110. A switching dielectric 116 is disposed over the bottom electrode 112. A top electrode 118 is disposed over the switching dielectric 116. A sidewall spacer layer 126 extends upwardly along sidewalls of the bottom electrode 112, the switching dielectric 116, and the top electrode 118. A lower etch stop layer 120 is disposed on the sidewall spacer layer 126. An upper dielectric layer 136 is disposed on the lower etch stop layer and overlying the memory cell 201. The upper dielectric layer 136 may be an oxide. The lower etch stop layer 120 has an etch selectivity different from the upper dielectric layer 136 and/or the sidewall spacer layer 126, such that the lower etch stop layer 120 covers and protects the top electrode 118 when the precursor materials of the upper dielectric layer 136 and/or the sidewall spacer layer 126 is etched back to expose the top electrode 118. A top electrode via 132 connects the top electrode 118 to the top metallization line 134. Though the memory cell 201 is shown as inserted between the upper metallization layer 226 and the lower metallization layer 224 in FIG. 2, it is appreciated that the memory cell 201 can be inserted between any two of the metallization layers of the BEOL metallization stack 218.

FIGS. 3-7 illustrate a series of cross-sectional views of some embodiments of a memory device at various stages of manufacture.

Figure 3:
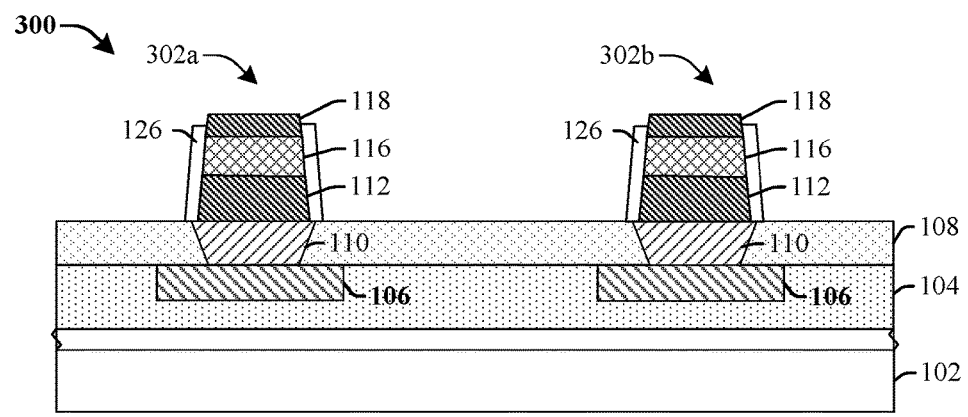
FIGS. 3-7 illustrate a series of cross-sectional views of some embodiments of a memory device at various stages of manufacture.

As shown in cross-sectional view 300 of FIG. 3, a first memory cell stack 302a and a second memory cell stack 302b are formed one next to another over a substrate 102 by depositing a multi-layer stack by a series of vapor deposition techniques (e.g., physical vapor deposition, chemical vapor deposition, etc.) followed by one or more patterning processes. The first memory cell stack 302a and the second memory cell stack 302b may be formed with different sizes. Each of the first and second memory cell stacks 302a, 302b comprises a bottom electrode 112, a switching dielectric 116 over the bottom electrode 112, a top electrode 118 over the switching dielectric 116, and a sidewall spacer layer 126 alongside sidewalls of the bottom electrode 112, the switching dielectric 116, and the top electrode 118. The sidewall spacer layer 126 may be formed by depositing a dielectric spacer layer on an upper surface of the lower dielectric layer 108, extending along sidewall surfaces of the bottom electrode 112, the switching dielectric 116, and the top electrode 118, and covering a top surface of the top electrode 118. Then an anisotropic etch (e.g. a vertical etch) may be performed to the dielectric spacer layer to remove lateral stretches of the dielectric spacer layer, thereby resulting in the sidewall spacer layer 126. As a result, the sidewall spacer layer 126 may have a top surface lower than that of the top electrode 118. The top surface of the sidewall spacer layer 126 may also be aligned or lower than a top surface of the top electrode 118. The dielectric spacer layer may comprise silicon nitride, tetraethyl orthosilicate (TEOS), silicon-rich oxide (SRO), or a similar composite dielectric film. In some embodiments, the dielectric spacer layer may be formed by a vapor deposition technique (e.g., physical vapor deposition, chemical vapor deposition, etc.).

Figure 4:
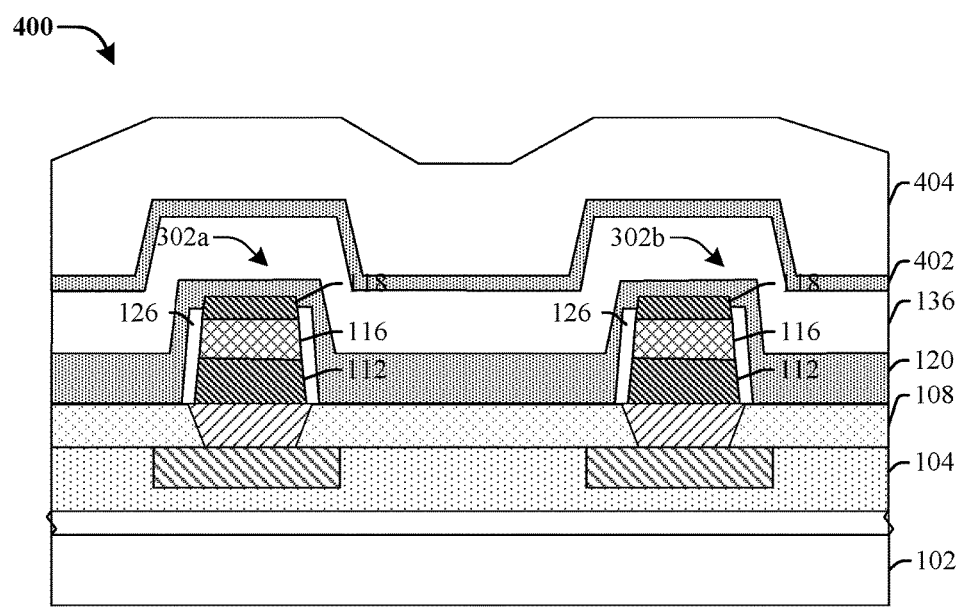

As shown in cross-sectional view 400 of FIG. 4, a plurality of dielectric layers is formed over and between the first memory cell stack 302a and the second memory cell stack 302b. The plurality of dielectric layers may include a lower etch stop layer 120 formed over the substrate 102 between and lining the first and second memory cell stacks 302a, 302b, an upper dielectric layer 136 formed over the lower etch stop layer 120, an upper etch stop layer 402 formed over the upper dielectric layer 136, and a polishing precursor layer 404 formed over the upper etch stop layer 402. The lower etch stop layer 120 may be made of a dielectric material different from the sidewall spacer layer 126 and the upper dielectric layer 136. The lower etch stop layer 120 may be, for example, silicon oxynitride (SiON). The upper dielectric layer 136 may be, for example, a low-k or an extreme low-k dielectric. In some embodiments, the upper etch stop layer 402 and the lower etch stop layer 120 are made of the same material. The upper dielectric layer 136 and the polishing precursor layer 404 may be silicon dioxide and may be formed by plasma enhanced atomic layer deposition (PEALD).

Figure 5:
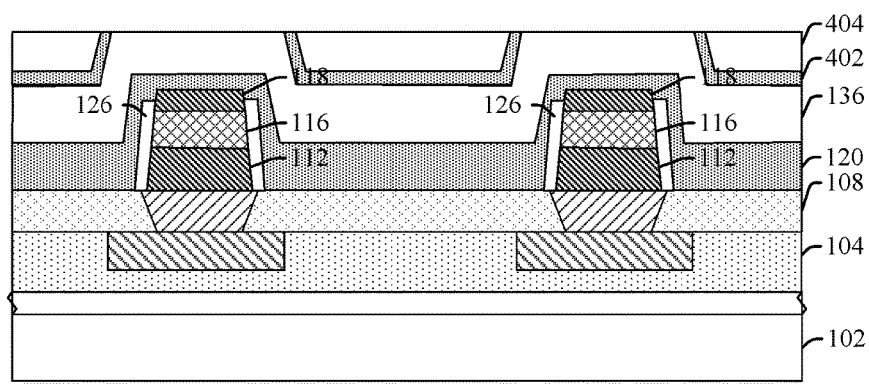

As shown in cross-sectional view 500 of FIG. 5, a first planarization/recessing process is performed to partially remove the upper etch stop layer 402 and the polishing precursor layer 404. In some embodiments, the first planarization/recessing process is a chemical-mechanical polishing (CMP) process. The first planarization/recessing process may be substantially non-selective to the upper etch stop layer 402 and the polishing precursor layer 404 such that the upper etch stop layer 402 and the polishing precursor layer 404 can have coplanar top surfaces as the etching result. After the first etching, a portion of the polishing precursor layer 404 and a portion of the upper etch stop layer 402 directly above the first memory cell stack 302a and the second memory cell stack 302b are removed by the first planarization/recessing process. A remaining portion of the polishing precursor layer 404 between the first memory cell stack 302a and the second memory cell stack 302b has sidewall and bottom surfaces surrounded by the remaining portion of the upper etch stop layer 402. A portion of the upper dielectric layer 136 directly above the memory cell stacks 302a, 302b is exposed. The exposed portion of the upper dielectric layer 136 may have a top surface substantially coplanar with the upper etch stop layer 402 or the polishing precursor layer 404.

Figure 6:
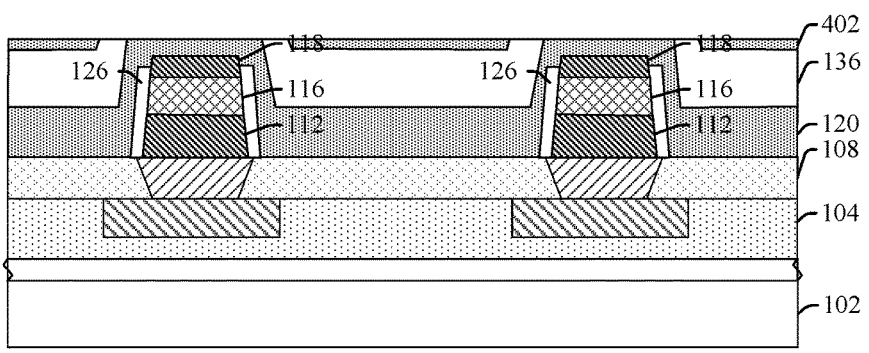

As shown in cross-sectional view 600 of FIG. 6, a second planarization/recessing process is performed to further lower the plurality of dielectric layers. The polishing precursor layer 404 may be removed and the upper etch stop layer 402 may be exposed at a peripheral region of the memory cell stacks 302a, 302b. A portion of the lower etch stop layer 120 directly above the memory cell stacks 302a, 302b is exposed. In some embodiments, the second planarization/recessing process is a chemical-mechanical polishing (CMP) process. The second planarization/recessing process may be highly selective to the upper dielectric layer 136 comparing to the upper etch stop layer 402 and the lower etch stop layer 120. For example, the upper dielectric layer 136 (e.g. a PEALD oxide layer) may have a removal rate about 10 times greater than the lower etch stop layer 120 (e.g. a SiON layer) and the upper etch stop layer 402 (e.g. a SiON layer) during the second planarization/recessing process. The lower etch stop layer 120 is more resistive to the etchant (comparing to the upper dielectric layer 136), thereby providing extra support and protection to the top electrode 118 from being damaged. The lower etch stop layer 120 may be made of a material having a etching rate smaller (e.g. about 50% smaller) than that of the sidewall spacer layer 126 (e.g. a SiN layer), such that more support can be provided to the memory cell stacks 302a, 302b and peripheral region by the lower etch stop layer 120 and the upper etch stop layer 402 during the first and second planarization/recessing processes.

Figure 7:
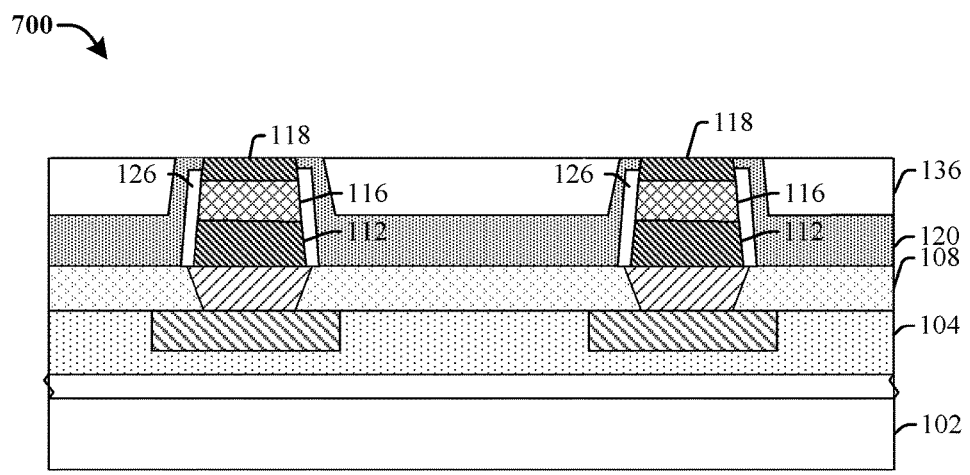

As shown in cross-sectional view 700 of FIG. 7, a blanket etch is performed to remove the upper etch stop layer 402 (shown in FIG. 6) and to further lower the lower etch stop layer 120 and the upper dielectric layer 136. As an etching result, the top electrodes 118 of the first and second memory cell stacks 302a, 302b are exposed. In some embodiments, referring to FIG. 2 for example, after performing the blanket etch, an interlayer dielectric layer 230 is formed overlying the top electrode 118, the sidewall spacer layer 126, and the upper dielectric layer 136. A top electrode via 132 is formed extending through the interlayer dielectric layer 230 to reach on the top electrode 118.

Figure 8:
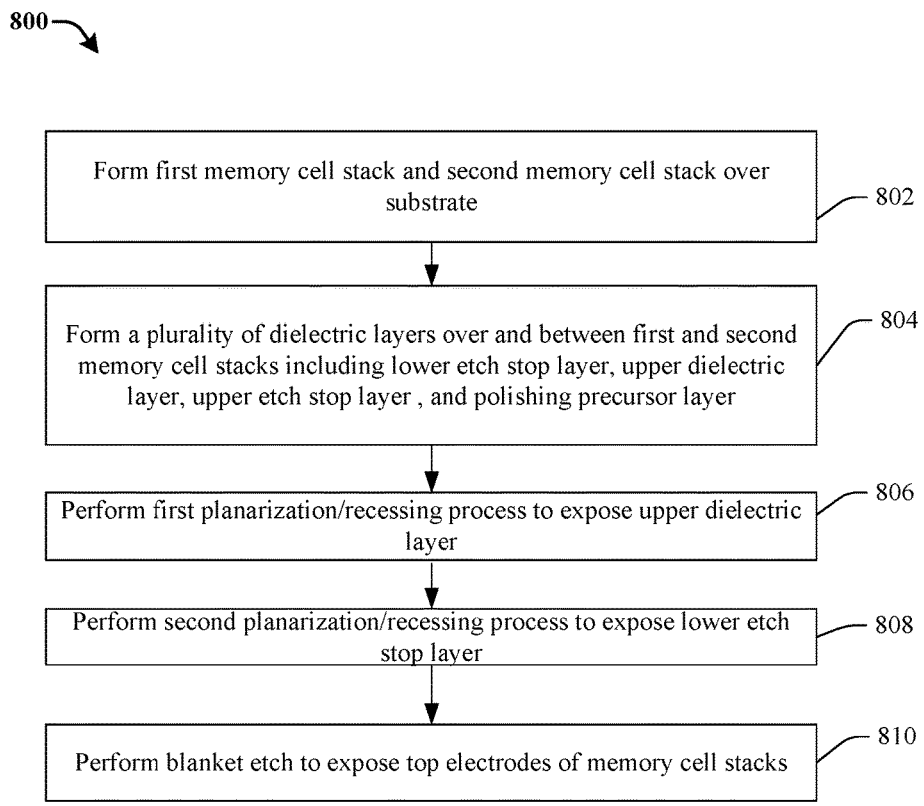
FIG. 8 illustrates a flow diagram of some embodiments of a method for manufacturing a memory device.

FIG. 8 shows some embodiments of a flow diagram of a method 800 of forming a memory device. Although method 800 is described in relation to FIGS. 3-7, it will be appreciated that the method 800 is not limited to such structures disclosed in FIGS. 3-7, but instead may stand alone independent of the structures disclosed in FIGS. 3-7. Similarly, it will be appreciated that the structures disclosed in FIGS. 3-7 are not limited to the method 800, but instead may stand alone as structures independent of the method 800. Also, while disclosed methods (e.g., method 800) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 802, a first memory cell stack and a second memory cell stack are formed one next to another over a substrate by depositing a multi-layer stack followed by one or more patterning processes. A sidewall spacer layer is formed alongside sidewalls of a bottom electrode, switching dielectric, and a top electrode of the memory cell stack. The sidewall spacer layer may be formed to have a top surface lower than that of the top electrode. The top surface of the sidewall spacer layer may also be aligned or lower than a top surface of the top electrode. FIG. 3 illustrates some embodiments of a cross-sectional view 300 corresponding to act 802.

At 804, a plurality of dielectric layers is formed over and between the first memory cell stack and the second memory cell stack. The plurality of dielectric layers may include a lower etch stop layer formed over the substrate between and lining the first and second memory cell stacks, an upper dielectric layer formed over the lower etch stop layer, an upper etch stop layer formed over the upper dielectric layer, and a polishing precursor layer formed over the upper etch stop layer. The lower etch stop layer may be, for example, silicon oxynitride (SiON). FIG. 4 illustrates some embodiments of a cross-sectional view 400 corresponding to act 804.

At 806, a first planarization/recessing process is performed to partially remove the upper etch stop layer and the polishing precursor layer. In some embodiments, the first planarization/recessing process is a chemical-mechanical polishing (CMP) process. The first planarization/recessing process may be substantially non-selective to the upper etch stop layer and the polishing precursor layer. A portion of the polishing precursor layer and a portion of the upper etch stop layer directly above the first and second memory cell stacks are removed by the first planarization/recessing process. A remaining portion of the polishing precursor layer between the first memory cell stack and the second memory cell stack has sidewall and bottom surfaces surrounded by the remaining portion of the upper etch stop layer. A portion of the upper dielectric layer directly above the memory cell stacks is exposed. FIG. 5 illustrates some embodiments of a cross-sectional view 500 corresponding to act 806.

At 808, a second planarization/recessing process is performed to further lower the plurality of dielectric layers. The polishing precursor layer may be removed and the upper etch stop layer may be exposed at a peripheral region of the memory cell stacks. A portion of the lower etch stop layer directly above the memory cell stacks is exposed. In some embodiments, the second planarization/recessing process is a chemical-mechanical polishing (CMP) process. FIG. 6 is illustrates some embodiments of a cross-sectional view 600 corresponding to act 808.

At 810, a blanket etch is performed to remove the upper etch stop layer and to further lower the lower etch stop layer and the upper dielectric layer. The top electrodes of the first and second memory cell stacks are exposed. FIG. 7 illustrates some embodiments of a cross-sectional view 700 corresponding to act 810.

FIGS. 9-13 illustrate a series of cross-sectional views of some embodiments of a memory device at various stages of manufacture.

Figure 9:
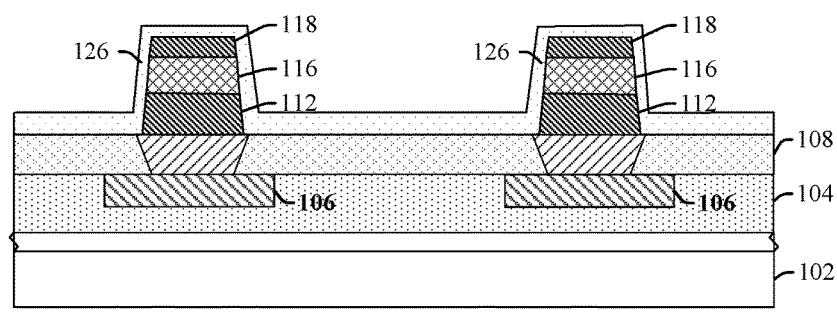
FIGS. 9-13 illustrate a series of cross-sectional views of some alternative embodiments of a memory device at various stages of manufacture.

As shown in cross-sectional view 900 of FIG. 9, a first memory cell stack 302a and a second memory cell stack 302b are formed one next to another over a substrate 102 by depositing a multi-layer stack by a series of vapor deposition techniques (e.g., physical vapor deposition, chemical vapor deposition, etc.) followed by one or more patterning processes. The first memory cell stack 302a and the second memory cell stack 302b may be formed with different sizes. Each of the first and second memory cell stacks 302a, 302b comprises a bottom electrode 112, a switching dielectric 116 over the bottom electrode 112, and a top electrode 118 over the switching dielectric 116. In some embodiments, the bottom electrode 112 is coupled to a bottom electrode via 110 surrounded by a lower dielectric layer 108. A sidewall spacer layer 126 is formed by depositing a dielectric spacer layer in conformal and directly on the lower dielectric layer 108 and extends upwardly along sidewalls of the bottom electrode 112, the switching dielectric 116, and the top electrode 118. The dielectric spacer layer may comprise silicon nitride, tetraethyl orthosilicate (TEOS), silicon-rich oxide (SRO), or a similar composite dielectric film. In some embodiments, the dielectric spacer layer may be formed by a vapor deposition technique (e.g., physical vapor deposition, chemical vapor deposition, etc.).

Figure 10:
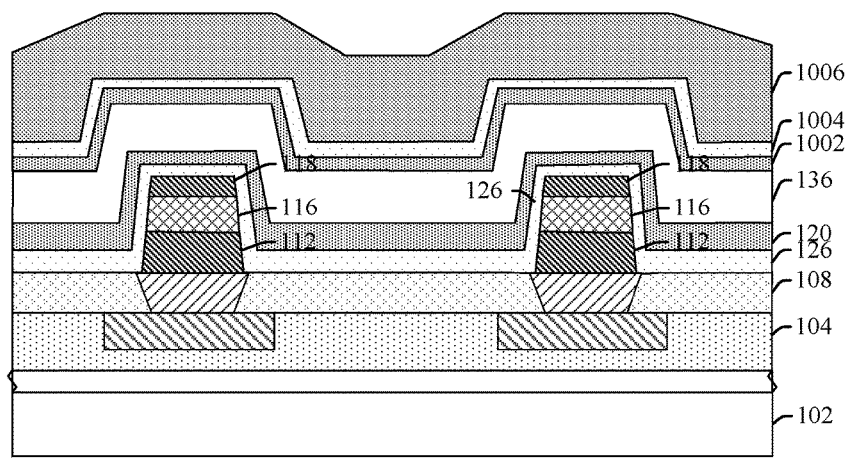

As shown in cross-sectional view 1000 of FIG. 10, a plurality of dielectric layers is formed over and between the first memory cell stack 302a and the second memory cell stack 302b and follows the curvature of the memory cell stacks 302a, 302b. The plurality of dielectric layers may include a lower etch stop layer 120 formed directly on the sidewall spacer layer 126, an upper dielectric layer 136 formed on the lower etch stop layer 120, an upper etch stop layer 1002 formed over the upper dielectric layer 136, an oxygen-containing dielectric layer 1004 formed over the upper etch stop layer 1002, and a polishing precursor layer 1006 formed over the oxygen-containing dielectric layer 1004. The lower etch stop layer 120 may be made of a dielectric material different from the sidewall spacer layer 126 and the upper dielectric layer 136. The lower etch stop layer 120 may be, for example, silicon oxynitride (SiON). The upper dielectric layer 136 may be, for example, a low-k or an extreme low-k dielectric. In some embodiments, the upper etch stop layer 1002 and the lower etch stop layer 120 are made of the same material. The upper dielectric layer 136 may be silicon dioxide and may be formed by plasma enhanced atomic layer deposition (PEALD). The oxygen-containing dielectric layer 1004 may comprise tetraethyl orthosilicate (TEOS). The polishing precursor layer 1006 may comprise anti-reflective coating material (e.g. carbon-containing BARC material).

Figure 11:
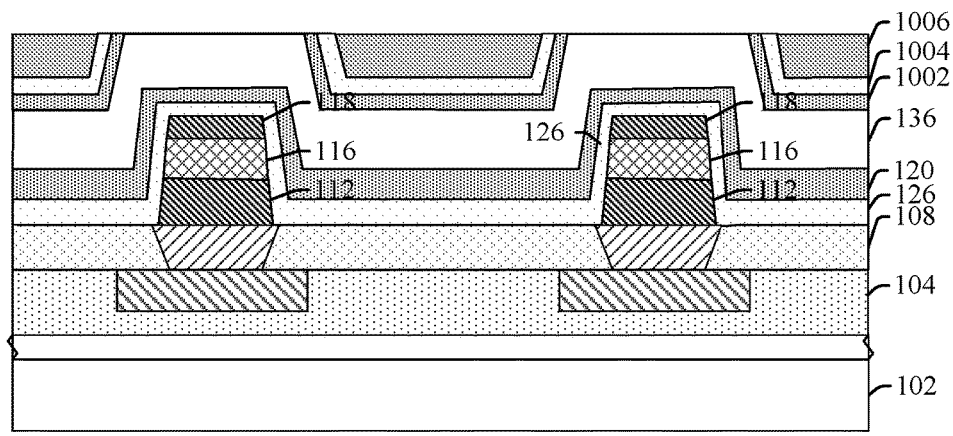

As shown in cross-sectional view 1100 of FIG. 11, a first planarization/recessing process is performed to partially remove the upper etch stop layer 1002, the oxygen-containing dielectric layer 1004, and the polishing precursor layer 1006. In some embodiments, the first planarization/recessing process comprises a dry etching back process that is selective to the polishing precursor layer 1006 comparing to the upper etch stop layer 1002. For example, the dry etching back process has an etching rate ratio of the polishing precursor layer 1006 to the upper etch stop layer 1002 greater than 6:1. The dry etching back is stopped on the upper etch stop layer 1002 by detecting oxygen of the oxygen-containing dielectric layer 1004. Then an over etch is performed to remove the oxygen-containing dielectric layer 1004 and the upper etch stop layer 1002 and to expose the upper dielectric layer 136 above the first memory cell stack 302a and the second memory cell stack 302b.

Figure 12:
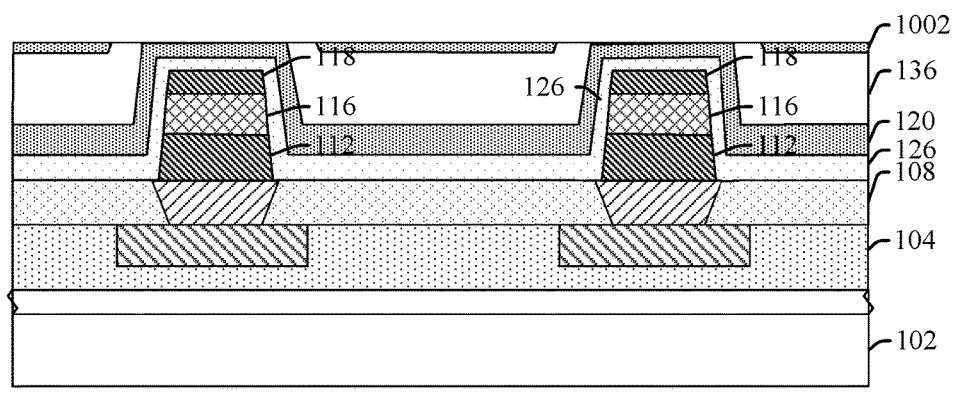

As shown in cross-sectional view 1200 of FIG. 12, a second planarization/recessing process is performed to further lower the plurality of dielectric layers. The polishing precursor layer 1006 may be removed and the upper etch stop layer 1002 may be exposed at a peripheral region of the memory cell stacks 302a, 302b. A portion of the lower etch stop layer 120 directly above the memory cell stacks 302a, 302b is exposed. In some embodiments, the second planarization/recessing process is a chemical-mechanical polishing (CMP) process. The second planarization/recessing process may be highly selective to the upper dielectric layer 136 comparing to the upper etch stop layer 1002 and the lower etch stop layer 120. For example, the upper dielectric layer 136 (e.g. a PEALD oxide layer) may have a removal rate about 10 times greater than the lower etch stop layer 120 (e.g. a SiON layer) and the upper etch stop layer 402 (e.g. a SiON layer) during the second planarization/recessing process. The lower etch stop layer 120 is more resistive to the etchant (comparing to the upper dielectric layer 136), thereby providing extra support and protection to the top electrode 118 from being damaged. The lower etch stop layer 120 may be made of a material having a etching rate smaller (e.g. about 50% smaller) than that of the sidewall spacer layer 126 (e.g. a SiN layer), such that more support can be provided to the memory cell stacks 302a, 302b and peripheral region by the lower etch stop layer 120 and the upper etch stop layer 1002 during the first and second planarization/recessing processes.

Figure 13:
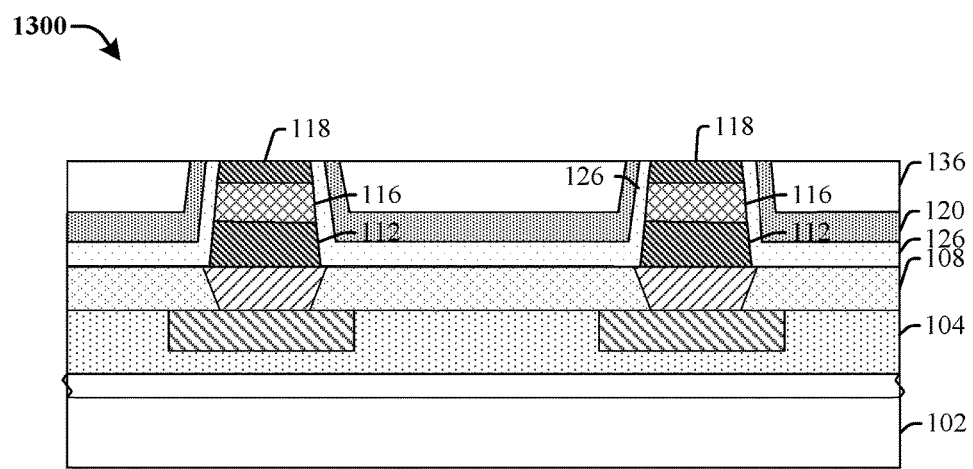

As shown in cross-sectional view 1300 of FIG. 13, a blanket etch is performed to remove the upper etch stop layer 1002 (shown in FIG. 12 and to further lower the lower etch stop layer 120 and the upper dielectric layer 136. As an etching result, the top electrodes 118 of the first and second memory cell stacks 302a, 302b are exposed. In some embodiments, referring to FIG. 2 for example, after performing the blanket etch, an interlayer dielectric layer 230 is formed overlying the top electrode 118, the sidewall spacer layer 126, and the upper dielectric layer 136. A top electrode via 132 is formed extending through the interlayer dielectric layer 230 to reach on the top electrode 118.

Figure 14:
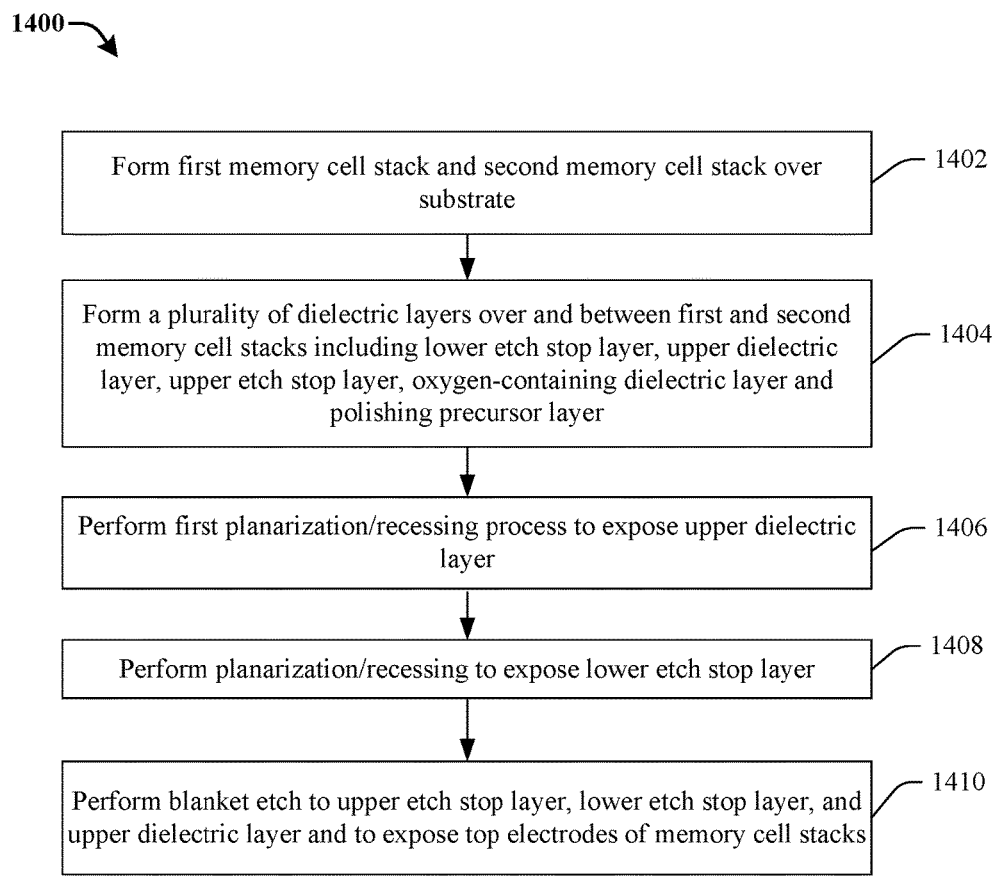
FIG. 14 illustrates a flow diagram of some alternative embodiments of a method for manufacturing a memory device.

FIG. 14 shows some embodiments of a flow diagram of a method 1400 of forming a memory device. Although method 1400 is described in relation to FIGS. 9-13, it will be appreciated that the method 1400 is not limited to such structures disclosed in FIGS. 9-13, but instead may stand alone independent of the structures disclosed in FIGS. 9-13. Similarly, it will be appreciated that the structures disclosed in FIGS. 9-13 are not limited to the method 1400, but instead may stand alone as structures independent of the method 1400. Also, while disclosed methods (e.g., method 1400) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1402, a first memory cell stack and a second memory cell stack are formed one next to another over a substrate by depositing a multi-layer stack followed by one or more patterning processes. A sidewall spacer layer is formed on a lower dielectric layer alongside sidewalls of the memory cell stack. The sidewall spacer layer may be formed in conformal. FIG. 9 illustrates some embodiments of a cross-sectional view 900 corresponding to act 1402.

At 1404, a plurality of dielectric layers is formed over and between the first memory cell stack and the second memory cell stack. The plurality of dielectric layers may include a lower etch stop layer formed over the substrate between and lining the first and second memory cell stacks, an upper dielectric layer formed over the lower etch stop layer, an upper etch stop layer formed over the upper dielectric layer, and an oxygen-containing dielectric layer and a polishing precursor layer formed over the upper etch stop layer. The lower etch stop layer may be, for example, silicon oxynitride (SiON). FIG. 10 illustrates some embodiments of a cross-sectional view 1000 corresponding to act 1404.

At 1406, a first planarization/recessing process is performed to partially remove the upper etch stop layer and the polishing precursor layer. In some embodiments, the first planarization/recessing process comprises a dry etching back process that is selective to the polishing precursor layer. The dry etching back process stops on the oxygen-containing dielectric layer and is followed by a more precise controlled etch to reach a planar surface after the etching. After the first planarization/recessing process, a portion of the upper dielectric layer directly above the memory cell stacks is exposed. FIG. 11 illustrates some embodiments of a cross-sectional view 1100 corresponding to act 1406.

At 1408, a second planarization/recessing process is performed to further lower the plurality of dielectric layers. The polishing precursor layer may be removed and the upper etch stop layer may be exposed at a peripheral region of the memory cell stacks. A portion of the lower etch stop layer directly above the memory cell stacks is exposed. In some embodiments, the second planarization/recessing process is a chemical-mechanical polishing (CMP) process. FIG. 12 illustrates some embodiments of a cross-sectional view 1200 corresponding to act 1408.

At 1410, a blanket etch is performed to remove the upper etch stop layer and to further lower the lower etch stop layer and the upper dielectric layer. The top electrodes of the first and second memory cell stacks are exposed. FIG. 13 illustrates some embodiments of a cross-sectional view 1300 corresponding to act 1410.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

Thus, as can be appreciated from above, the present disclosure provides a memory cell. The memory cell comprises a bottom electrode via surrounded by a lower dielectric layer and disposed over a substrate. A bottom electrode is disposed on the bottom electrode via. A switching dielectric is disposed over the bottom electrode and having a variable resistance. A top electrode is disposed over the switching dielectric. A sidewall spacer layer extends upwardly along sidewalls of the bottom electrode, the switching dielectric, and the top electrode. A lower etch stop layer is disposed over the lower dielectric layer and lining an outer sidewall of the sidewall spacer layer. An upper dielectric layer is disposed on the lower etch stop layer and surrounding an upper portion of the sidewall spacer layer. The lower etch stop layer is made of a material different from the sidewall spacer layer.

In another embodiment, the present disclosure relates to a method of manufacturing an integrated circuit (IC). The method comprises forming and patterning a first memory cell stack and a second memory cell stack having different sizes one next to another over a substrate. Each of the memory cell stacks comprises a bottom electrode, a switching dielectric over the bottom electrode, a top electrode over the switching dielectric, and a sidewall spacer layer alongside sidewalls of the bottom electrode, the switching dielectric, and the top electrode. The method further comprises forming an upper dielectric layer over the substrate between and lining the first and second memory cell stacks and forming an upper etch stop layer over the upper dielectric layer. The method further comprises performing a first chemical-mechanical polishing (CMP) process to expose the upper dielectric layer directly above the memory cell stacks and performing a blanket etch to remove the upper etch stop layer and to further lower the upper dielectric layer and expose the top electrodes of the first and second memory cell stacks.

In yet another embodiment, the present disclosure relates to a method of manufacturing an integrated circuit (IC). The method comprises forming and patterning a first memory cell stack and a second memory cell stack having different sizes one next to another over a substrate. Each of the memory cell stacks comprises a bottom electrode, a switching dielectric over the bottom electrode, a top electrode over the switching dielectric, and a sidewall spacer layer alongside sidewalls of the bottom electrode, the switching dielectric, and the top electrode. The method further comprises forming a lower etch stop layer over the substrate between and lining the first and second memory cell stacks, forming an upper dielectric layer over the lower etch stop layer, forming an upper etch stop layer over the upper dielectric layer, and forming a polishing precursor layer over the upper etch stop layer. The method further comprises performing a first chemical-mechanical polishing (CMP) process to expose the upper dielectric layer directly above the memory cell stacks, and performing a second chemical-mechanical polishing (CMP) process to lower the upper etch stop layer between the memory cell stacks and to expose the lower etch stop layer directly above the memory cell stacks. The method further comprises performing a blanket etch to remove the upper etch stop layer and to partially remove the lower etch stop layer and expose the top electrodes of the first and second memory cell stacks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a memory device, the method comprising:
    forming and patterning a first memory cell stack and a second memory cell stack having different sizes one next to another over a substrate, each of the memory cell stacks comprising a bottom electrode, a switching dielectric over the bottom electrode, a top electrode over the switching dielectric, and a sidewall spacer layer alongside sidewalls of the first memory cell stack and the second memory cell stack;
    forming an upper dielectric layer over the substrate between and lining the first and second memory cell stacks;
    forming an upper etch stop layer over the upper dielectric layer;
    performing a first chemical-mechanical polishing (CMP) process to expose the upper dielectric layer directly above the memory cell stacks; and
    performing a blanket etch to remove the upper etch stop layer and to further lower the upper dielectric layer and expose the top electrodes of the first and second memory cell stacks.

2. The method of claim 1, prior to performing the first CMP process, further comprising:
    forming a polishing precursor layer over the upper etch stop layer;
    wherein a portion of the polishing precursor layer directly above the first memory cell stack and the second memory cell stack is removed by the first CMP process and a remaining portion of the polishing precursor layer between the first memory cell stack and the second memory cell stack has sidewall and bottom surfaces surrounded by the upper etch stop layer.

3. The method of claim 2, further comprising:
    performing a dry etching back process to the polishing precursor layer prior to performing the first CMP process;
    wherein the dry etching back process has an etching rate ratio of the polishing precursor layer to the upper dielectric layer greater than 6:1.

4. The method of claim 2, wherein the upper dielectric layer and the polishing precursor layer are formed by plasma enhanced atomic layer deposition (PEALD).

5. The method of claim 2, wherein the first chemical-mechanical polishing (CMP) process has a substantial same etching rate for the upper etch stop layer and the polishing precursor layer.

6. The method of claim 1, further comprising:
    forming a lower etch stop layer over the substrate between and lining the first and second memory cell stacks prior to forming the upper dielectric layer; and
    after performing the first CMP process, performing a second chemical-mechanical polishing (CMP) process to further lower the upper etch stop layer and to expose the lower etch stop layer directly above the memory cell stacks.

7. The method of claim 6, wherein the upper etch stop layer and the lower etch stop layer are made of the same material.

8. The method of claim 6, wherein the upper etch stop layer and the lower etch stop layer are made of silicon oxynitride.

9. The method of claim 1, after performing the blanket etch, further comprising:
    forming an interlayer dielectric layer overlying the top electrode, the sidewall spacer layer, and the upper dielectric layer; and
    forming a top electrode via extending through the dielectric layer to reach on the top electrode.

10. The method of claim 1, wherein the sidewall spacer layer is formed by forming a dielectric spacer layer followed by performing an etch to the dielectric spacer layer to remove lateral stretches of the dielectric spacer layer and thereby resulting in the sidewall spacer layer.

11. A method for manufacturing a memory device, the method comprising:
    forming and patterning a first memory cell stack and a second memory cell stack having different sizes one next to another over a substrate, each of the memory cell stacks comprising a bottom electrode, a switching dielectric over the bottom electrode, a top electrode over the switching dielectric, and a sidewall spacer layer alongside sidewalls of the bottom electrode, the switching dielectric, and the top electrode;
    forming a lower etch stop layer over the substrate between and lining the first and second memory cell stacks;
    forming an upper dielectric layer over the lower etch stop layer;
    forming an upper etch stop layer over the upper dielectric layer;
    forming a polishing precursor layer over the upper etch stop layer;
    performing a first chemical-mechanical polishing (CMP) process to expose the upper dielectric layer directly above the memory cell stacks;
    performing a second chemical-mechanical polishing (CMP) process to lower the upper etch stop layer between the memory cell stacks and to expose the lower etch stop layer directly above the memory cell stacks; and performing a blanket etch to remove the upper etch stop layer and to partially remove the lower etch stop layer and expose the top electrodes of the first and second memory cell stacks.

12. A method for manufacturing a memory device, the method comprising:

forming a bottom electrode via surrounded by a lower dielectric layer and over a substrate;

forming a bottom electrode on the bottom electrode via;

forming a switching dielectric over the bottom electrode and having a variable resistance and a top electrode over the switching dielectric;

forming a dielectric spacer layer on an upper surface of the lower dielectric layer, extending along sidewall surfaces of the bottom electrode, the switching dielectric, and the top electrode, and covering a top surface of the top electrode;

performing an etch to the dielectric spacer layer to remove lateral stretches of the dielectric spacer layer and thereby resulting in a sidewall spacer layer;

forming a lower etch stop layer lining an outer sidewall of the sidewall spacer layer; and forming an upper dielectric layer on the lower etch stop layer and surrounding an upper portion of the sidewall spacer layer;

wherein the lower etch stop layer is made of a material different from the sidewall spacer layer.

13. The method of claim 12, wherein the lower etch stop layer is made of silicon oxynitride and the sidewall spacer layer is made of silicon nitride.

14. The method of claim 12, wherein top surfaces of the lower etch stop layer and the upper dielectric layer are formed to be coplanar.

15. The method of claim 14, wherein a top surface of the sidewall spacer layer is formed to directly contact and be covered by the lower etch stop layer, and to be lower than a top surface of the top electrode.

16. The method of claim 12, wherein top surfaces of the top electrode, the lower etch stop layer, and the upper dielectric layer are formed to be coplanar.

17. The method of claim 12, wherein the lower etch stop layer is formed to directly contact the upper dielectric layer.

18. The method of claim 12, wherein the sidewall spacer layer is formed to be separated from the upper dielectric layer by the lower etch stop layer.

19. The method of claim 12, wherein the lower etch stop layer is made of silicon oxynitride and the upper dielectric layer is made of silicon oxide.

20. The method of claim 12, further comprising:

forming a bottom metallization line surrounded by a bottom interlayer dielectric layer and coupled to the bottom electrode through the bottom electrode via; and forming a top metallization line surrounded by a top interlayer dielectric layer and directly contacting the top electrode;

wherein bottom surfaces of the top metallization line and the top interlayer dielectric layer and top surfaces of the top electrode and the lower etch stop layer are coplanar.

* * * * *